(12) United States Patent
Gerlach et al.

(10) Patent No.: US 6,836,519 B1
(45) Date of Patent: Dec. 28, 2004

(54) AUTOMATIC DIGITAL SCALING FOR DIGITAL COMMUNICATION SYSTEMS

(75) Inventors: Derek Gerlach, Mountain View, CA (US); James Gardner, San Ramon, CA (US); Vincent K. Jones, IV, Redwood City, CA (US)

(73) Assignee: Cisco Technology, Inc., San Jose, CA (US)

( * ) Notice: Subject to any disclaimer, the term of this patent is extended or adjusted under 35 U.S.C. 154(b) by 566 days.

(21) Appl. No.: 09/742,889

(22) Filed: Dec. 20, 2000

(51) Int. Cl.[7] .................................................. H04L 27/08
(52) U.S. Cl. ..................... 375/345; 375/316; 455/234.1
(58) Field of Search ................... 375/345, 260, 375/350, 346, 316; 455/234.1, 234.2, 239.1, 240.1, 241.1, 245.1, 245.2, 246.1, 247.1, 251.1, 253.2

(56) References Cited

U.S. PATENT DOCUMENTS

| | | | |
|---|---|---|---|
| 5,627,857 A | 5/1997 | Wilson | 375/219 |
| 6,081,564 A | 6/2000 | Han | 375/345 |
| 6,452,987 B1 * | 9/2002 | Larsson et al. | 375/345 |
| 6,556,636 B1 * | 4/2003 | Takagi | 375/350 |
| 6,591,092 B1 * | 7/2003 | Tsuruoka | 455/232.1 |
| 6,614,855 B1 * | 9/2003 | Okamoto | 375/316 |
| 2001/0048727 A1 * | 12/2001 | Schmutz et al. | 375/345 |
| 2001/0055328 A1 * | 12/2001 | Dowling | 375/130 |

* cited by examiner

*Primary Examiner*—Phuong Phu
(74) *Attorney, Agent, or Firm*—Ritter, Lang & Kaplan LLP (57) ABSTRACT

Improved receiver automatic gain control for OFDM-based communication systems is provided, thus realizing the full potential of OFDM systems to handle rapid variation in channel characteristics. The improved automatic gain control technique can also accommodate reception of multiple OFDM signals having disparate power levels via the same analog receiver chain and analog to digital converter while minimizing the arithmetic precision necessary for optimal digital processing. By reducing the necessary arithmetic precision, the cost of implementing the receiver with integrated circuit technology is greatly reduced.

17 Claims, 8 Drawing Sheets

AUTOMATIC DIGITAL SCALING FOR DIGITAL COMMUNICATION SYSTEMS

BACKGROUND OF INVENTION

The present invention relates to digital communication systems and more particularly to optimizing operation where received signal power varies rapidly.

In a wireless environment, the received signal energy can vary over many orders of magnitude due to variations in the characteristics of the communication channel. Moreover, the variations in received signal strength are typically frequency selective. Digital communication systems have until recently principally relied on single carrier quadrature amplitude modulation (SC-QAM). Such systems employ an analog automatic gain control (AGC) loop and an adaptive equalizer to handle the variations in received signal strength. The mean signal power is controlled by the AGC loop while the digital adaptive equalizer attempts to handle the frequency selective gain variations. Such equalizers vary their frequency response based on ongoing measurements of channel characteristics. However, even such systems can accommodate rapid channel variations only by employing a low-density constellation thus greatly limiting the number of data bits communicated by each symbol.

A new type of digital communication system based on orthogonal frequency division multiplexing (OFDM) copes far more effectively with rapid channel variation. OFDM divides the available spectrum within a channel into narrow subchannels. In a given so-called "burst," each subchannel transmits one data symbol. Each subchannel therefore operates at a very low data rate compared to the channel as a whole. To achieve transmission in orthogonal subchannels, a burst of frequency domain symbols are converted to the time domain by an IFFT procedure. To assure that orthogonality is maintained in dispersive channels, a cyclic prefix is added to the resulting time domain sequence. The cyclic prefix is a duplicate of the last portion of the time domain sequence and is appended to the beginning.

To handle varying channel characteristics, some of the frequency domain subchannels carry training symbols that have fixed values known at the receiver. The receiver can estimate and correct for the channel response at each burst by measuring the received values of the training symbols. This process can handle rapid channel variation far more effectively than the adaptive equalizers employed by SC-QAM systems.

However, correction of symbol values for measured variation in channel response is only one aspect of handling rapid time variation. The IFFT procedure, channel estimation, and correction for measured channel response are all typically accomplished by digital signal processing. Additionally, there is usually also digital filtering. A digital to analog converter precedes the digital stages in the receiver chain. The analog signal at the converter input must be kept within a range that assures accurate converter operation.

Prior art digital communication receivers incorporate automatic gain control loops that vary the mean analog receiver gain to assure proper operation of the digital to analog converter. Though the adjustment speeds of these loops can be very high, the performance of the SC-QAM system is limited by the capability of the digital adaptive equalizer in handling time varying signals, i.e., frequency selective signal variations. Improvements in receiver automatic gain control are required to take advantage of the superior performance of OFDM in time varying channel environments.

Further challenges arise when considering the application of OFDM to point to multipoint communication systems that interconnects a central access point with multiple subscriber units. Multiple OFDM signals may be frequency multiplexed onto adjacent channels. To minimize complexity and cost, the analog receiver stages have a bandwidth that includes all of the multiple signals. These signals will then be separated from one another by digital filters between the analog to digital converter and parallel IFFT stages that operate independently on each of the multiple signals. For correct operation and to minimize the needed arithmetic precision, input to each of the IFFT stages should be within a defined range. An automatic gain control loop that sets gain based on the analog to digital converter input level only will be unable to also assure optimal signal processing operation.

SUMMARY OF INVENTION

Improved receiver automatic gain control for OFDM-based communication systems is provided by virtue of one embodiment of the present invention, thus realizing the full potential of OFDM systems to handle rapid variation in channel characteristics. The improved automatic gain control technique can also accommodate reception of multiple OFDM signals having disparate power levels via the same analog receiver chain and analog to digital converter while minimizing the arithmetic precision necessary for optimal digital processing. By reducing the necessary arithmetic precision, the cost of implementing the receiver with integrated circuit technology is greatly reduced.

According to one aspect of the present invention, a digital communication receiver includes: an analog receiver system that receives an analog signal and amplifies the analog signal responsive to a first gain control level, an analog to digital converter that converts the amplified analog signal to a digital signal, a digital filter that filters the digital signal to select the desired digital information signal, a scaling element that digitally scales the desired digital information signal according to a second gain control level, a transform element that transforms the desired digital information signal into the frequency domain, and a first gain control loop that adjusts the first gain control level to optimize operation of the analog to digital converter.

A further understanding of the nature and advantages of the inventions herein may be realized by reference to the remaining portion of the specification and the attached drawings.

DESCRIPTION OF SPECIFIC EMBODIMENTS

Figure 1:
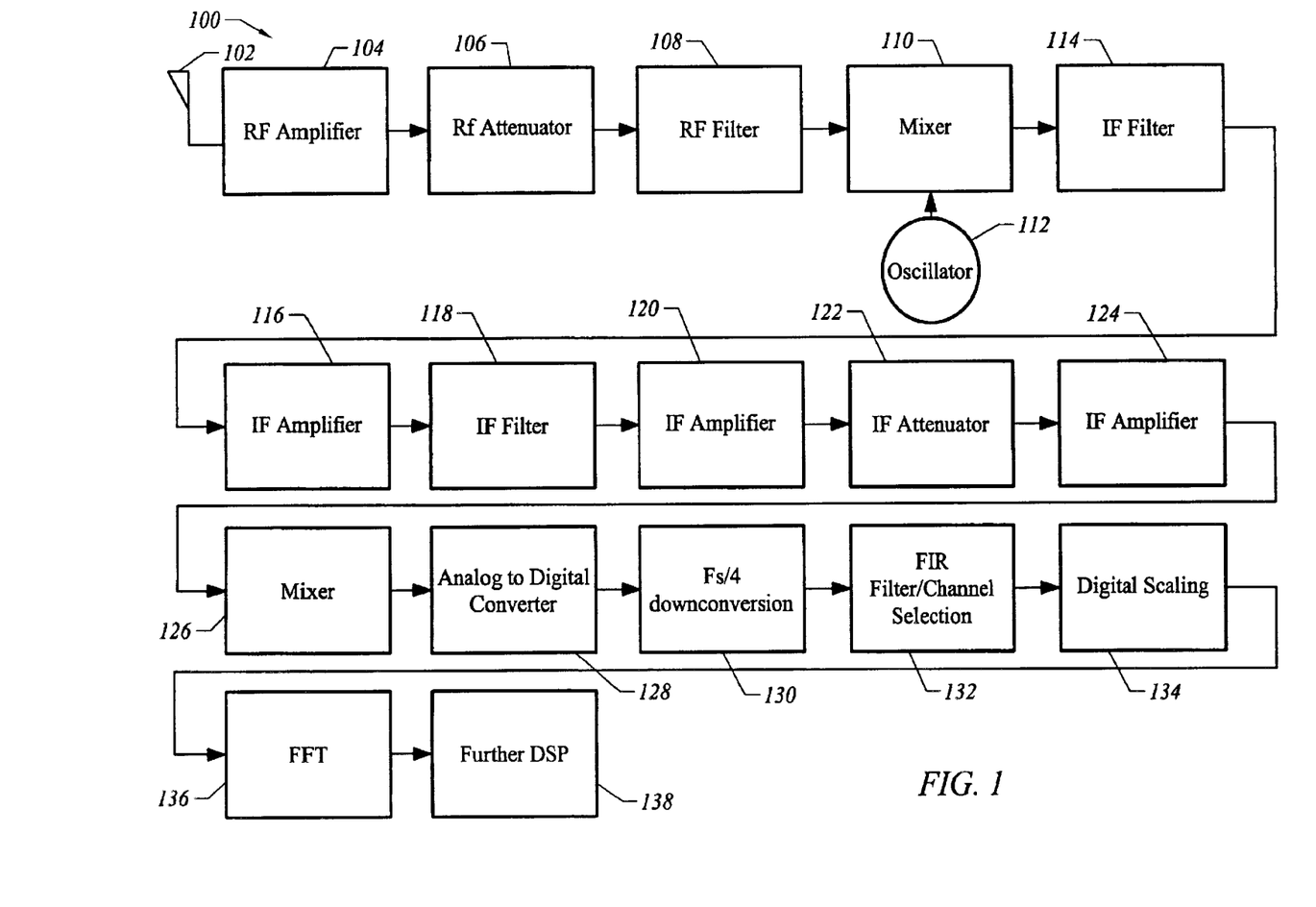
FIG. 1 depicts elements of a receiver system that may exploit aspects of the present invention.

FIG. 1 depicts an OFDM receiver system 100 that may exploit automatic gain control techniques provided by the present invention. Signals are received via an antenna 102 and amplified by low noise RF amplifier 104. In one embodiment, the RF signals received via antenna 102 are in the MMDS band (2.15–2.162 GHz and 2.5–2.69 GHz). Once amplified, the RF signals are attenuated by an RF attenuator 106. The degree of attenuation will be controlled by an RF automatic gain control loop as explained below.

A mixer 110 downconverts the RF signal to an intermediate frequency (IF), e.g., 330 MHz, by combining the RF signal with the output of an oscillator 112. A first IF filter 114 selects the desired IF signals and rejects any undesired sperious signals or images. The IF signal is amplified by a first IF amplifier 116 and then filtered within a second IF filter 118, then amplified again by a third IF amplifier 120. An IF attenuator 122 sets a desired IF amplification level under the control of an IF gain control loop as will be described below. A third IF amplifier 124 provides a final stage of amplification at the intermediate frequency.

A second mixer 126 downconverts the IF signal to a baseband signal. Up until this point, the signal is analog but an analog to digital converter 128 converts the analog signal to a sequence of digital samples. The output of converter 128 has an associated sampling rate, $F_s$. The output of converter 128 is a sequence of real values. A further downconversion stage 130 shifts the center frequency of the digital sample stream by $F_s/4$ to convert the real sample sequence to a complex sample sequence.

An FIR filter 132 digitally filters the output of downconversion stage 130. In some systems, blocks 102 through 130 may process multiple signals within a frequency range. For example, the receiver of FIG. 1 may be at the head end of a point to multi-point system that receives signals from multiple transmitters at multiple adjacent frequencies. In this type of application, there may be multiple FIR filter blocks 132 in parallel (not shown), each selecting one particular transmitted signal at a different frequency. A digital scaling block 134 sets an appropriate digital signal amplitude in preparation for input to an FFT block 136. FFT block 136 removes cyclic prefixes from individual OFDM bursts and converts them to the frequency domain. A block 138 then performs additional signal processing including channel estimation, error correction decoding, interference cancellation, etc.

FIG. 1 omits the elements that control gain at various stages of the receiver. The gain control loop system that will be discussed below controls analog attenuation in both RF attenuator 106 and IF attenuator 122. It also sets the digital scaling factor for digital scaling 134. One goal of the gain control system is to set an input analog amplitude for analog to digital converter 128 that assures optimal converter operation. In one embodiment the average energy input to the converter 128 is regulated to a threshold equal to –17 dB below a full-scale setting of the converter. At the same time the signal input to analog to digital converter 128 should not be permitted to vary below the noise floor of the converter.

A digital gain control loop adjusts the scaling factor imposed by block 134. This gain control is in addition to the gain control loops that control RF and IF attenuation. One motivation for including digital gain control is that the waveforms processed up through downconversion stage 130 may include multiple signals on adjacent frequencies leaving it to FIR filter 132 to pick one desired digital signal. The analog control loops react to the total power of all the signals within the analog receiver bandwidth and thus will not regulate the power level of a particular signal selected by FIR filter 132. The digital gain control loop operates to set the amplitude of the desired signal input to FFT block 136 to an optimal level. In one embodiment, this level is –17 dB below full scale. This assures proper operation of FFT block 136 and other signal processing stages while minimizing the arithmetic precision required to capture the dynamic range of the desired signal.

The analog automatic gain control loop adjusts the attenuation level of RF attenuator 106 and IF attenuator 122 to maintain the input of analog to digital converter 128 within the desired range, and also to distribute amplification along the analog receiver chain so as to optimize analog receiver sensitivity and dynamic range.

Figure 8:
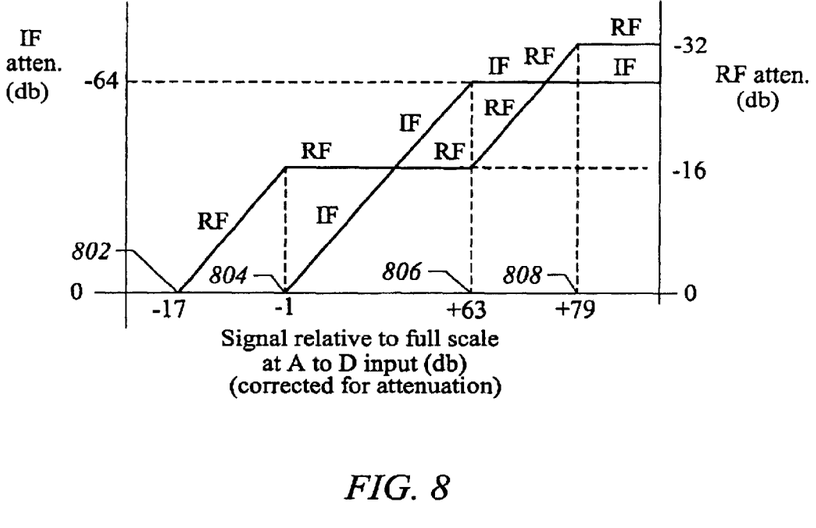
FIG. 8 depicts variation in RF and IF attenuation according to one embodiment of the present invention.

FIG. 8 depicts how IF attenuation and RF attenuation are varied as the signal level input to RF amplifier 104 varies. The horizontal axis measures the input power level to the receiver but is calibrated in terms of the signal level relative to full scale at the analog to digital converter input corrected for the total attenuation being applied. When the input signal level is less than a first threshold 802, both the RF and IF attenuation are kept at minimum values, 0 dB. As the signal power level rises from first threshold 802 up until a second threshold 804, the RF attenuation increases while the IF attenuation is kept constant. Between second threshold 804 and a third threshold 806 the RF attenuation is left constant while the IF attenuation increases. Between third threshold 806 and a fourth threshold 808, RF attenuation is increased up to its maximum value while IF attenuation is kept constant. After fourth threshold 808, both RF and IF attenuations are at their maximum value.

Figure 2:
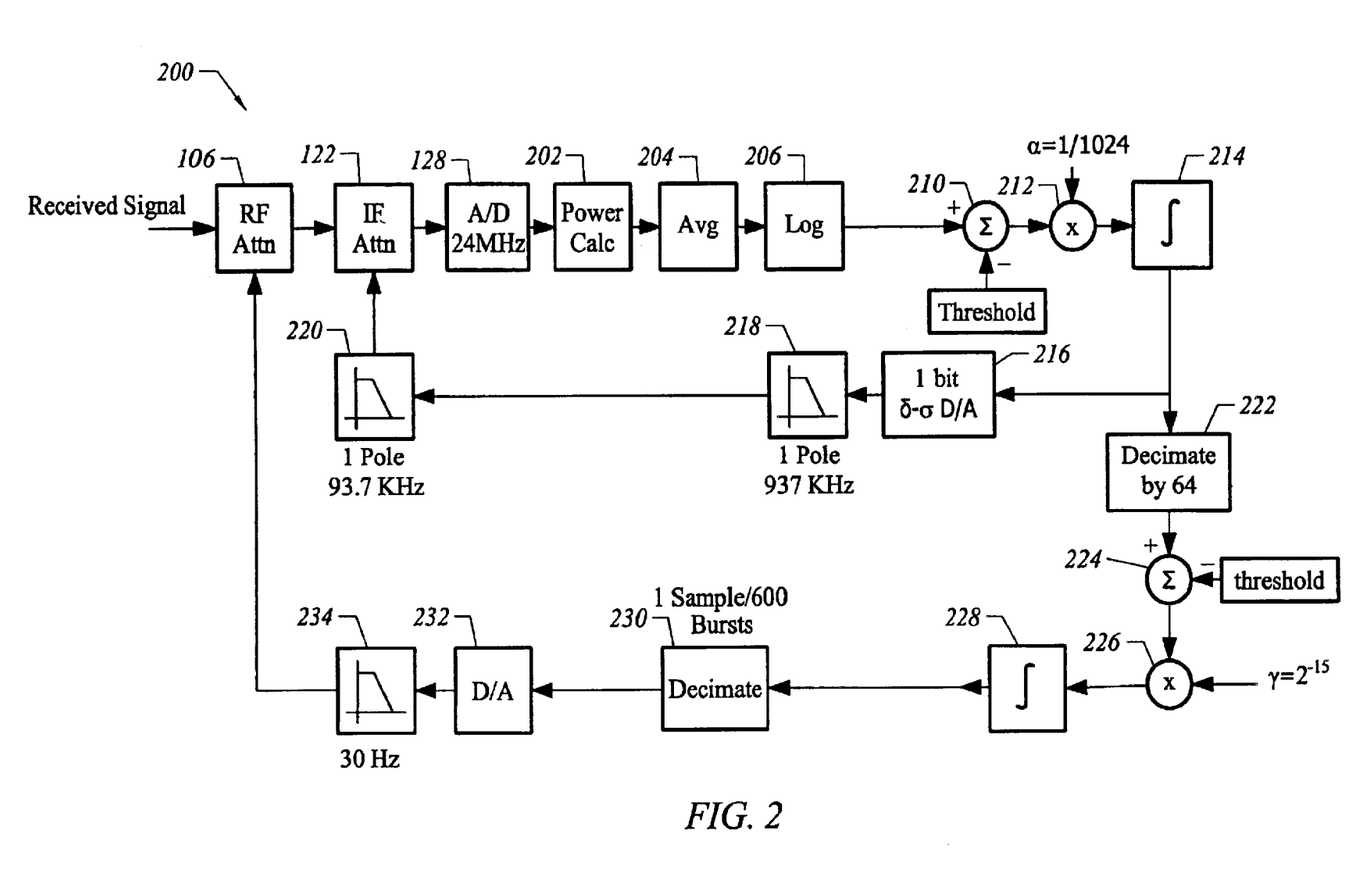
FIG. 2 depicts elements of an overall receiver analog automatic gain control loop according to one embodiment of the present invention.

FIG. 2 depicts elements of an analog gain control loop 200 according to one embodiment of the present invention. RF attenuator 106, IF attenuator 122, and analog to digital converter 128 are depicted as part of the loop but other receiver elements are omitted for clarity of presentation. Analog automatic gain control loop 200 includes an RF gain control loop that controls the attenuation of RF attenuator 106 and an IF automatic gain control loop that controls the attenuation of IF attenuator 122. The two control loops share some elements in common.

Figure 5:
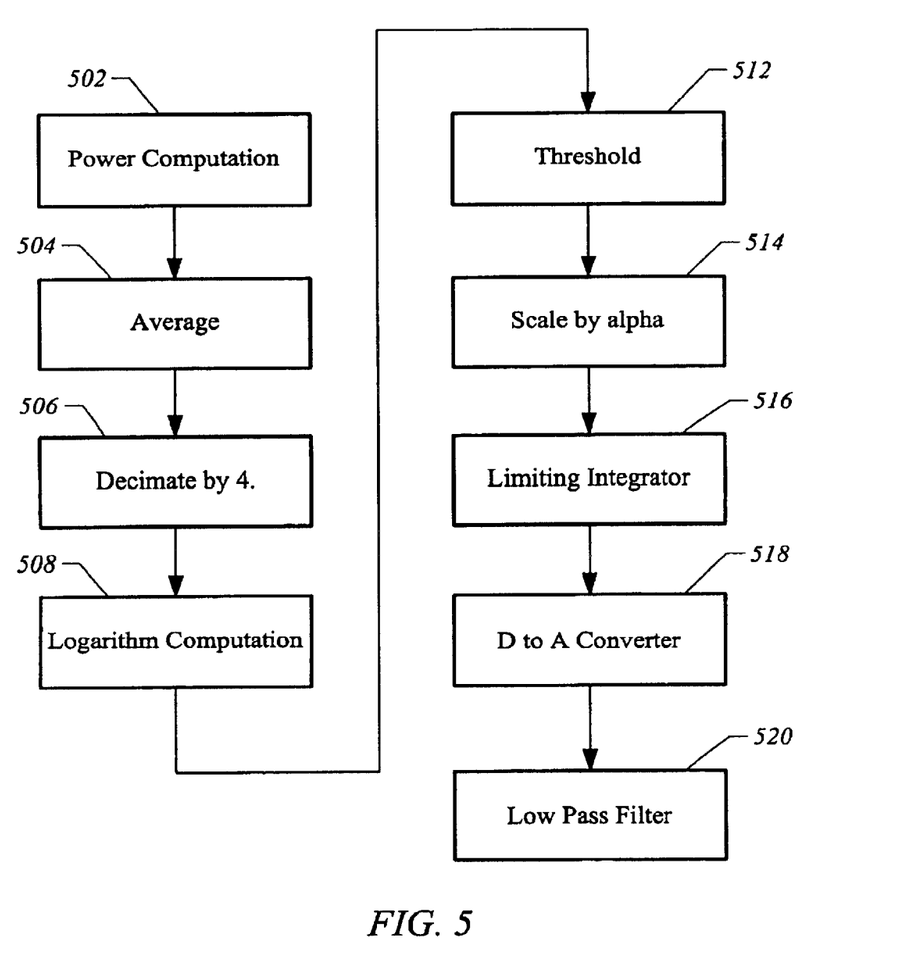
FIG. 5 is a flowchart describing operation of an IF automatic gain control loop according to one embodiment of the present invention.

The IF automatic gain control loop will now be described with reference to both FIG. 2 and a flow chart depicted in FIG. 5. The IF automatic gain control loop has a loop bandwidth of 200 Hz and a dynamic range of 64 dB.

At step 502 a power calculation block 202 measures the signal power level at the output of analog to digital converter 128 by applying the expression $y(n)=x(n)^2$ where $y(n)$ is the output of block 202 and $x(n)$ is the input to block 202. Analog to digital converter 128 runs at 24 MHz sampling rate and this power computation is performed for every sample. The computation employs 12 bits that are uniformly quantized between 0 and 1. The output of power calculation block 202 is averaged over time at step 504 by an averaging block 204. This average is computed by $y(n+1)=(1-\beta)x(n)+\beta y(n)$ where $y(n)$ is the output of averaging block 204, $x(n)$ is the input to averaging block 204, and $\beta$ is a programmable constant.

At step 506, the output of averaging block 204 is decimated by 4 to modify the sampling rate. Then at step 508, a logarithm computation block 206 approximates the logarithm of the decimated sampled averages by $y(n)=b+(x(n)-2^b)/2^b$ where $b=\text{floor}(\log_2(x(n)), y(n))$ is the output of block 206, and $x(n)$ is the input to block 206.

Due to the logarithm calculation, the digital samples at the output of block 206 reflect dB values. A thresholding block 210 forms a threshold signal at step 512 by subtracting a desired energy threshold value in dB from the average energy values present at the output of block 206. The threshold value should be set to be the desired back off value from full scale for the analog to digital converter in dB divided by 3. For example, to achieve an average power that is −17 dB below the saturation level of the converter, the threshold should be set to −17/3 dB. At step 514, a scaling block 212 multiplies the error signal by a scaling factor, $\alpha$. The value $\alpha$ may be programmable. In one embodiment, $\alpha=2^n$ where n is between −8 and −11, e.g., $\alpha=1/1024$.

At step 516 a limiting integrator, 214 integrates the scaled output of scaling block 212. Integrator 214 operates according to the expression $y(n+1)=x(n)+y(n)$ where $x(n)$ is the integrator input and $y(n)$ is the integrator output. Within limiting integrator 214, $y(n)$ is represented by 22 bits uniformly quantized between −31 and 31 dB. Only 12 of these bits, however, are presented as output. A one-bit sigma-delta type digital to analog converter 216 then converts, at step 518, the successive digital values to analog form. The output of converter 216 is an analog control signal. At step 520, this analog control signal is low pass filtered before being used to set the IF attenuation level of IF attenuator 122. There are two low pass filters. A first low pass filter 218 has a knee frequency of 93.7 kHz. A second low pass filter 220 has a knee frequency of 937 kHz. Both filters have a DC gain of 1. The overall dynamic range of the IF loop is 50 dB.

Figure 7:
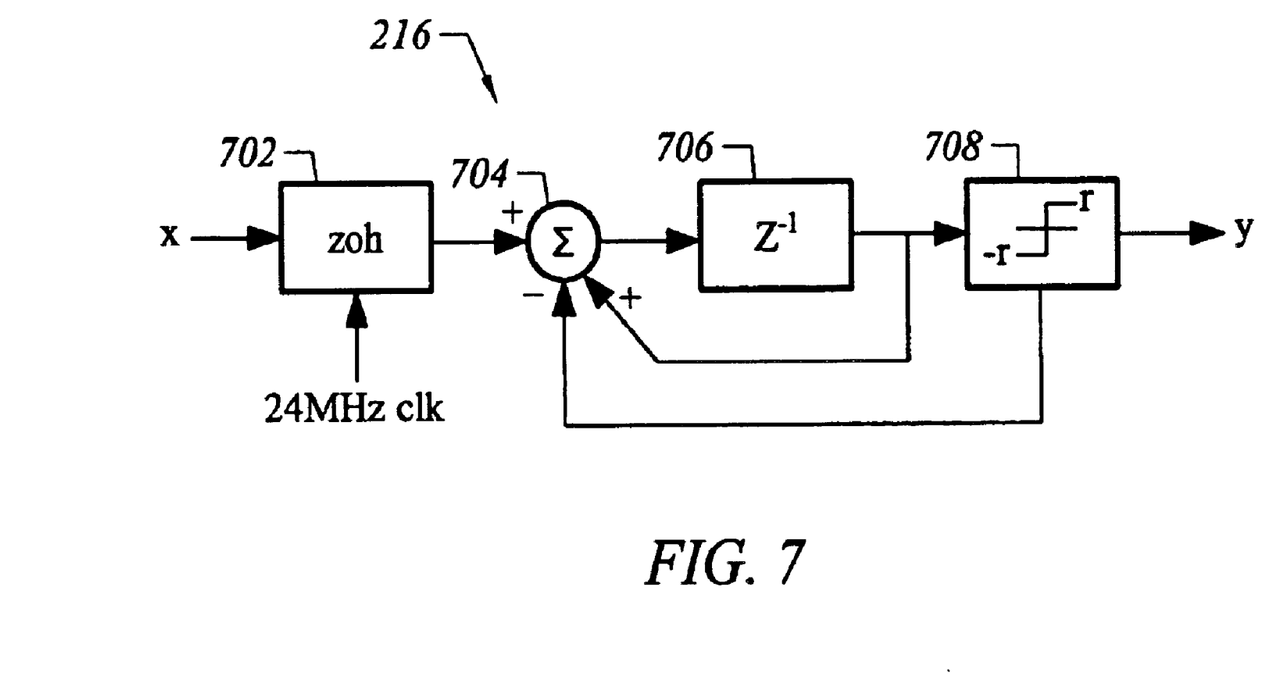
FIG. 7 depicts elements of a sigma-delta digital to analog converter according to one embodiment of the present invention.

FIG. 7 depicts details of sigma-delta digital to analog converter 216. A zero-order hold block 702 accepts the 12 bit digital input at a 24 MHz clock rate. A summing junction 704 sums together the output of zero-order hold block 702, the inverse of the overall converter output, and the output of a delay element 706 that follows summing junction 704. A comparator 708 outputs a +r voltage for positive binary values and a −r voltage for negative binary values.

Figure 4:
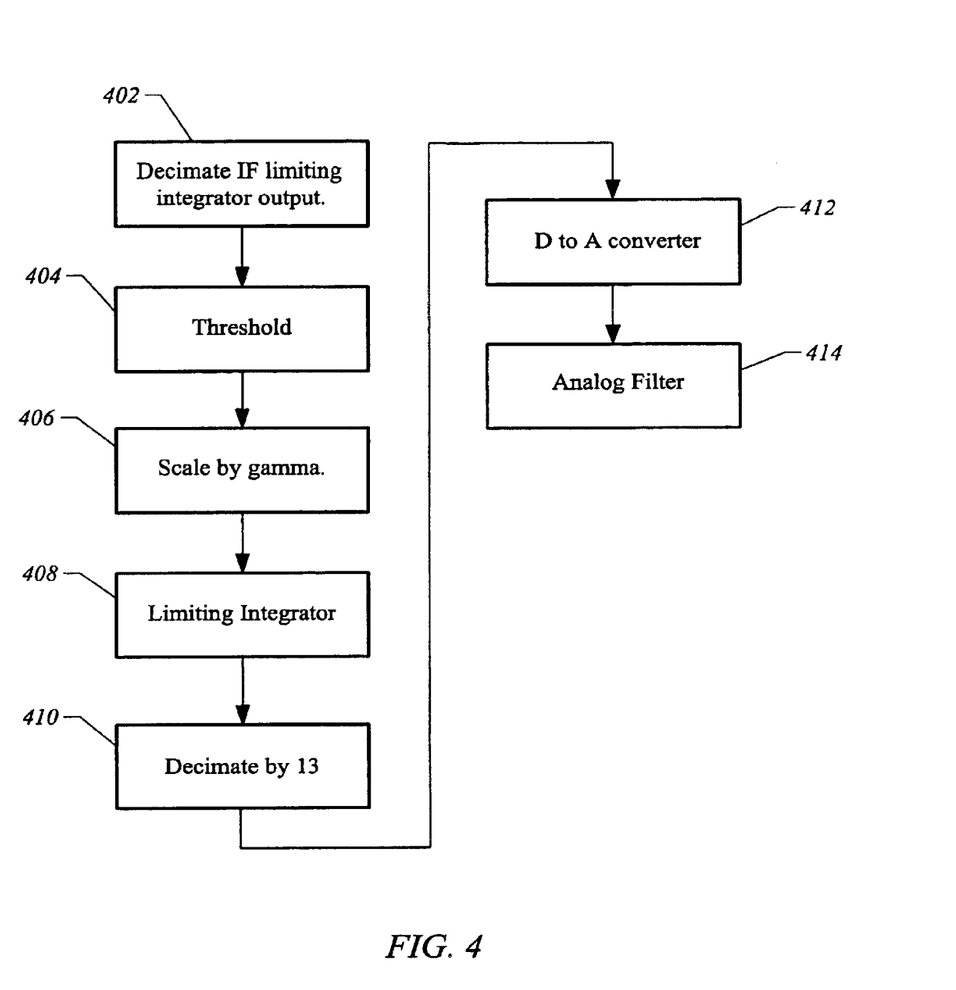
FIG. 4 is a flowchart describing operation of an RF automatic gain control loop according to one embodiment of the present invention.

The RF automatic gain control loop will now be described with reference to FIG. 2 and the flowchart depicted by FIG. 4. The RF automatic gain control loop tracks very slow variations in channel response, e.g., <0.1 Hz over a dynamic range of 25 dB.

The RF automatic gain control loop shares incorporates components of the IF gain control loop from power calculation block 202 up through limiting integrator 214. For the RF automatic gain control loop, a decimation block 222 follows limiting integrator 214 and cuts the sampling rate from 24 MHz to 187.5 kHz at step 402. At step 404, a threshold value is subtracted from the output of decimation block 222 by a thresholding block 224. The subtracted threshold value is programmable. At step 406, a scaling block 226 multiplies the error signal output of thresholding block 224 by a scaling factor, $\gamma$. The value, $\gamma$, may be programmable. In one embodiment, $\gamma$, equals $2^n$ where n is between −11 and −17, e.g., $\gamma=2^{-15}$.

At step 408, a limiting integrator 228 integrates the output of scaling block 226. Limiting integrator 228 operates according to the expression $y(n+1)=x(n)+y(n)$ where $x(n)$ is the integrator input and $y(n)$ is the integrator output. The value $y(n)$ is represented within limiting integrator 228 as 26 bits uniformly quantized between −25 and 25 dB. The output of limiting integrator 228 is quantized to 8 bits. At step 410, a decimation block 230 downsamples by 13. In one embodiment, there is one output sample of decimation block 230 for every 600 OFDM bursts.

Then at step 412, the decimated sample stream is converted to an analog signal by an 8-bit digital to analog converter 232. At step 414, an analog low pass filter 234 low pass filters this analong signal. The filtered analog signal is then used to control the RF attenuation level of RF attenuator 106. The knee frequency of low pass filter 234 is 30 Hz. The DC gain is equal to one.

Figure 6:
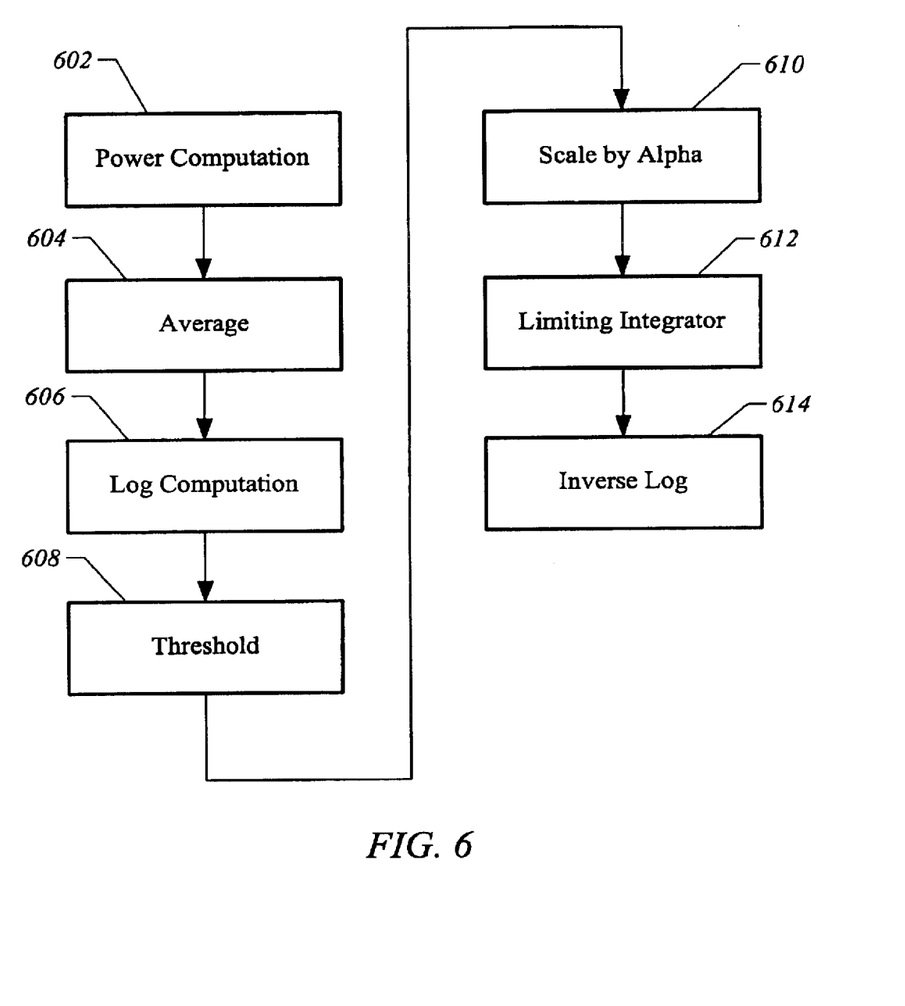
FIG. 6 is a flowchart describing operation of a digital automatic gain control loop according to one embodiment of the present invention.

The digital automatic gain control loop will be described now with reference to FIG. 3 which depicts the loop elements and FIG. 6 which depicts a flow chart describing steps of digital automatic gain control loop operation. The digital automatic gain control loop has a loop bandwidth of 200 Hz.

Figure 3:
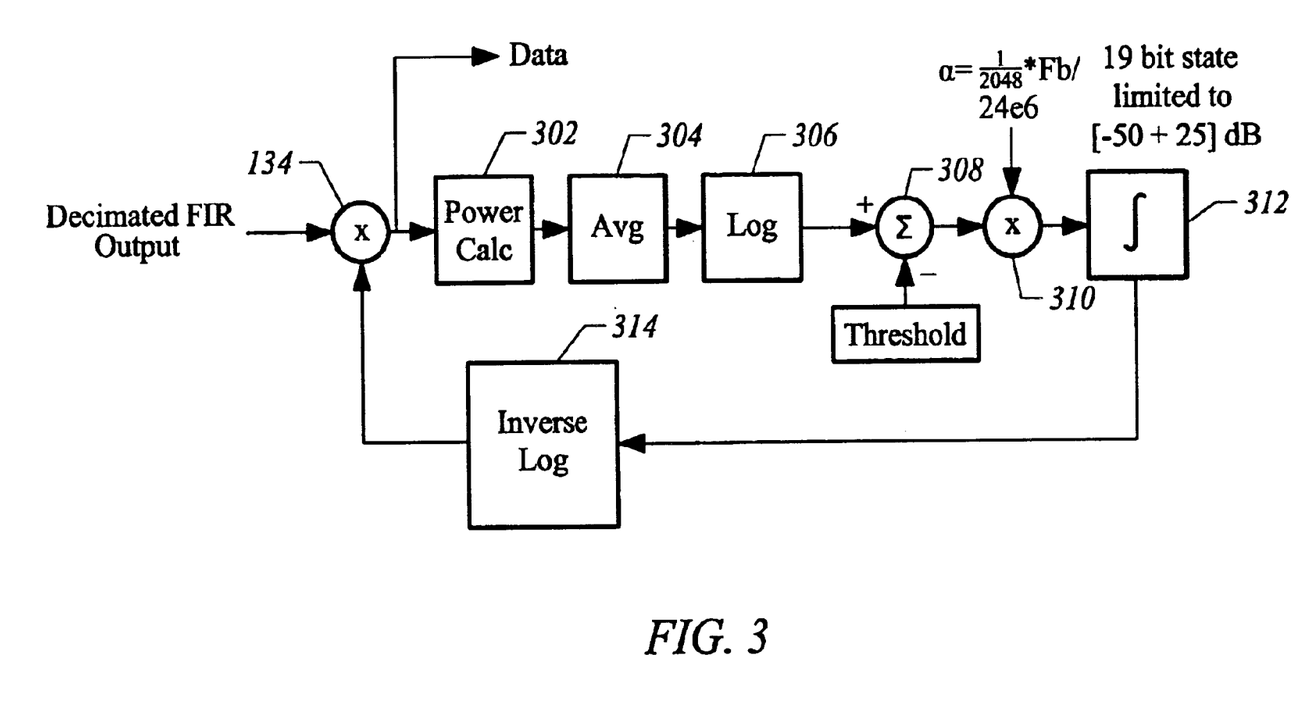
FIG. 3 depicts elements of a receiver digital automatic gain control loop according to one embodiment of the present invention.

In FIG. 3, digital scaling element 134 is depicted as a multiplier. The output of digital scaling element 134 goes to both FFT block 136 depicted in FIG. 1 and to a power calculation element 302. At step 602, power calculation element 302 computes power every sample time n where the sampling rate is the receiver digital baseband bandwidth, $F_b$. The power calculation is represented as $y(n)=x(n)^2$ where $y(n)$ is the power calculation element output and $x(n)$ is the power calculation element input. The value $y(n)$ is computed as a 16-bit word with uniform quantization between 0 and 1.

At step 604, an averaging block 304 computes a moving average of the output of power calculation element 302 by applying the formula $y(n+1)=(1-\beta)x(n)+\beta y(n)$, where $x(n)$ is the input to averaging element 304, $y(n)$ is the output of averaging element 304, and $\beta$ is a programmable constant that may be equivalent to the $\beta$ used within the analog control loop.

At step 606, there is a logarithm computation by a logarithm element 306. Logarithm element 306 uses the same approximation used by the analog automatic gain control loop at step 508. This logarithm computation is followed by a threshold step 608 where a thresholding element 308 subtracts a threshold value from the output of logarithm element 306. Then at step 610 a scaling element 310 scales by $\alpha$(not the same $\alpha$ used in the analog control loop). In one embodiment, the value, $\alpha$, equals $$2^{-n} * \frac{24 \times 10^6}{F_b}$$

where n is between 9 and −2. For example, $\alpha$, may be $$\frac{1}{2048} * \frac{24 \times 10^6}{F_b}.$$

Then at step 612 a limiting integrator 312 integrates the output of scaling element 310. Limiting integrator 312 operates according to the expression $y(n+1)=x(n)+y(n)$ where $x(n)$ is the integrator input and $y(n)$ is the integrator output. Within limiting integrator 312, $y(n)$ is maintained as a 25-bit number uniformly quantized between −50 and 25 dB. The output of limiting integrator 312 is a 14-bit number.

At step 614, an inverse log operation block 314 takes the inverse logarithm of the output of limiting integrator 312 applying the expression $g(n)=10^{0.05*x}$ (R) where $x(n)$ is the input to inverse log operation block 314 and $g(n)$ is the output. The output of block 314 is then used to scale the digital samples received from FIR filter 132 prior to processing by FFT block 136. The digital control loop provides for optimal operation of the FFT as well as other signal processing operations such as channel estimation, channel correction, and interference cancellation while allowing for reduced precision arithmetic thereby decreasing the cost of implementation in an integrated circuit. In one embodiment, intermediate calculations for the FFT employ 16 bits of precision with the output employing 12 bits of precision.

It is understood that the examples and embodiments described herein are for illustrative purposes only and that various modifications and changes in light thereof will be suggested to persons skilled in the art and are to be included within the spirit and purview of this application and the scope of the append to claims and their fall scope of equivalents. For example, all of the signal processing parameters and formulas described herein are merely examples and may be eliminated or replaced within the scope of the present invention.

What is claimed is:

1. In a digital communication receiver, a method of gain control comprising:
   receiving an analog signal;
   processing said analog signal including amplifying said analog signal according to a first gain control level;
   converting said analog signal to a digital signal;
   filtering said digital signal to select a desired digital information signal;
   digitally scaling said desired digital information signal according to a second gain control level;
   transforming said desired digital information signal into the frequency domain;
   adjusting said first gain control level to optimize said converting; and
   adjusting said second gain control level to optimize said transforming.

2. The method of claim 1 wherein processing comprises converting said analog signal from an RF frequency to an IF frequency.

3. The method of claim 2 wherein amplifying said analog signal according to said first gain control level comprises amplifying said analog signal at said RF frequency.

4. The method of claim 3 wherein amplifying further comprises:
   amplifying said analog signal at said IF frequency according to a third gain control level.

5. The method of claim 1 wherein adjusting said first gain control level comprises:
   monitoring amplitude of said analog signal after processing and prior to converting said analog signal to said digital signal; and
   varying said first gain control level to maintain said monitored amplitude of said analog signal within a desired range.

6. The method of claim 1 wherein adjusting said second gain control level comprises:
   monitoring an amplitude of said desired digital information signal;
   varying said second gain control level to maintain said monitored amplitude of said desired digital information signal within a desired range.

7. The method of claim 1 wherein adjusting said first gain control level comprises:
   monitoring amplitude of said analog signal; and
   varying said first gain control level to maintain said monitored amplitude of said analog signal within a desired range.

8. The method of claim 7 wherein adjusting said second gain control level comprises:
   monitoring an amplitude of said desired digital information signal; and
   varying said second gain control level to maintain said monitored amplitude of said desired digital information signal within a desired range.

9. A digital communication receiver comprising:
   an analog receiver system that receives an analog signal and amplifies said analog signal responsive to a first gain control level;
   an analog to digital converter that converts said amplified analog signal to a digital signal;
   a digital filter that filters said digital signal to select a desired digital information signal;
   a scaling element that digitally scales said desired digital information signal according to a second gain control level;
   a transform element that transforms said desired digital information signal into the frequency domain;
   a first gain control loop that adjusts said first gain control level to optimize operation of said analog to digital converter: and
   a second gain control loop that adjusts said second gain control level to optimize operation of said transform element.

10. The receiver of claim 9 further comprising a mixer that converts said analog signal from an RF frequency to an IF frequency.

11. The receiver of claim 10 wherein said analog receiver system amplifies said analog signal at said RF frequency according to said first gain control level.

12. The receiver of claim 11 wherein said analog receiver system further amplifies said analog signal at said IF frequency according to a third gain control level.

13. The receiver of claim 9 wherein said first gain control loop comprises:
   a power monitor stage that monitors amplitude of said analog signal; and
   a feedback system that varies said first gain control level to maintain said monitored amplitude of said analog signal within a desired range.

14. The receiver of claim 9 wherein said second gain control loop comprises:
   a power monitor stage that monitors an amplitude of said desired digital information signal; and
   a feedback system that varies said second gain control level to maintain said monitored amplitude of said desired digital information signal within a desired range.

15. The receiver of claim 9 wherein said first gain control loop comprises:
   a first power monitor stage that monitors amplitude of said analog signal; and
   a first feedback system that varies said first gain control level to maintain said monitored amplitude of said analog signal within a desired range.

16. The receiver of claim 15 wherein said second gain control loop comprises:
- a second power monitor stage that monitors an amplitude of said desired digital information signal; and
- a second feedback system that varies said second gain control level to maintain said monitored amplitude of said desired digital information signal within a desired range.

17. A digital communication receiver comprising:
- means for converting said amplified analog signal to a digital signal;
- means for digitally filtering said digital signal to select a desired digital information signal;
- scaling means for digitally scaling said desired digital information signal according to a second gain control level;
- means for transforming said desired digital information signal into the frequency domain; and
- first gain control means for adjusting said first gain control level to optimize operation of said converting means; and
- second gain control means for adjusting said second gain control level to optimize operation of said transforming means.

* * * * *